(12) United States Patent
Wang et al.

(10) Patent No.: US 11,075,304 B1
(45) Date of Patent: Jul. 27, 2021

(54) THIN-FILM TRANSISTOR AND FABRICATION METHOD THEREOF, ARRAY SUBSTRATE AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Jun Wang, Beijing (CN); Zhonghao Huang, Beijing (CN); Yongliang Zhao, Beijing (CN); Seungmoo Rim, Beijing (CN)

(73) Assignees: BOE TECHNOLOGY GROUP CO., LTD., Beijing (CN); CHONGQING BOE OPTOELECTRONICS TECHNOLOGY CO., LTD, Chongqing (CN)

(*) Notice: Subject to any disclaimer, the term of this patent is extended or adjusted under 35 U.S.C. 154(b) by 659 days.

(21) Appl. No.: 16/064,087

(22) PCT Filed: Dec. 18, 2017

(86) PCT No.: PCT/CN2017/116896
§ 371 (c)(1),
(2) Date: Jun. 20, 2018

(87) PCT Pub. No.: WO2019/010920
PCT Pub. Date: Jan. 17, 2019

(30) Foreign Application Priority Data

Jul. 14, 2017 (CN) .......................... 201710575147.7

(51) Int. Cl.
*H01L 21/467* (2006.01)
*H01L 21/4757* (2006.01)
*H01L 21/4763* (2006.01)
*H01L 27/12* (2006.01)
*H01L 29/66* (2006.01)
*H01L 29/786* (2006.01)

(52) U.S. Cl.
CPC .. *H01L 29/78696* (2013.01); *H01L 29/66969* (2013.01); *H01L 21/467* (2013.01);
(Continued)

(58) Field of Classification Search
CPC ......... H01L 29/78696; H01L 29/66969; H01L 29/7869; H01L 21/467; H01L 21/47573; H01L 21/47635; H01L 27/1225
(Continued)

(56) References Cited

U.S. PATENT DOCUMENTS 7,521,717 B2   4/2009  Hwang
9,450,106 B2   9/2016  Han et al.
(Continued)

FOREIGN PATENT DOCUMENTS

CN      1369917 A     9/2002
CN      1841781 A    10/2006
CN    105226100 A     1/2016

OTHER PUBLICATIONS

Office Action dated Mar. 19, 2020, issued in counterpart CN Applicatio No. 201710575147.7, with English translation (15 pages).
(Continued)

*Primary Examiner* — Tong-Ho Kim
(74) *Attorney, Agent, or Firm* — Westerman, Hattori, Daniels & Adrian, LLP

(57) ABSTRACT

A thin film transistor is disclosed. The thin-film transistor includes an active layer (3); a source electrode (1); and a drain electrode (2). The active layer includes an active pattern region (4), the active pattern region including a main body portion (5) and a plurality of protrusion portions (6) on both sides of the main body portion. The protrusion portions are connected to the main body portion.

13 Claims, 9 Drawing Sheets

(52) U.S. Cl.
CPC .. *H01L 21/47573* (2013.01); *H01L 21/47635* (2013.01); *H01L 27/1225* (2013.01); *H01L 29/7869* (2013.01)

(58) Field of Classification Search
USPC .......................................................... 257/66
See application file for complete search history.

(56) References Cited

U.S. PATENT DOCUMENTS

| | | | |
|---|---|---|---|
| 2006/0220020 A1* | 10/2006 | Hwang | H01L 29/66757 257/59 |
| 2007/0148799 A1* | 6/2007 | Yang | H01L 27/1214 438/30 |
| 2009/0146150 A1* | 6/2009 | Hosoya | H01L 27/1214 257/59 |
| 2011/0273639 A1* | 11/2011 | Xie | H01L 27/124 349/43 |
| 2013/0270554 A1* | 10/2013 | Yokoyama | H01L 29/7869 257/43 |
| 2015/0380567 A1* | 12/2015 | Han | H01L 29/42384 257/365 |

OTHER PUBLICATIONS

International Search Report dated Apr. 8, 2018, issued in counterpart International Application No. PCT/JP2017/116896 (10 pages).

\* cited by examiner

THIN-FILM TRANSISTOR AND FABRICATION METHOD THEREOF, ARRAY SUBSTRATE AND DISPLAY DEVICE

CROSS-REFERENCE TO RELATED APPLICATIONS

This application claims the benefit of the filing date of Chinese Patent Application No. 201710575147.7 filed on Jul. 14, 2017, the disclosure of which is hereby incorporated by reference.

TECHNICAL FIELD

This disclosure relates to a display technology, and more particularly, a thin-film transistor and a fabrication method thereof, an array substrate, and a display apparatus.

BACKGROUND

A thin-film transistor (TFT) is a kind of field-effect transistor made by depositing thin films of an active semiconductor layer as well as the dielectric layer and metallic contacts over a supporting (but non-conducting) substrate. A common substrate is glass, because the primary application of TFTs is in liquid-crystal displays.

BRIEF SUMMARY

Accordingly, one example of the present disclosure is a thin-film transistor. The thin-film transistor may comprise an active layer; a source electrode; and a drain electrode. The active layer may comprise an active pattern region. The active pattern region may comprise a main body portion and a plurality of protrusion portions on both sides of the main body portion. The protrusion portions may be connected to the main body portion. The protrusion portions may have a shape of rectangular, triangular, or trapezoidal. The protrusion portions and the main body portion may be substantially in a same plane. There may be equal number of the protrusion portions on both sides of the main body portion. There may be no slope between the main body portion and the protrusion portions. The active pattern region may be axial symmetric or central symmetric. The thin-film transistor may comprise two or more patterns of the active layers. A width of the main body portion may be between 5 μm and 15 μm.

The active layer may comprise active edge regions on both sides of the active pattern region. A threshold voltage of either of the active edge regions may be greater than that of the active pattern region. The active edge regions may be sloped regions away from the active pattern region on both sides of the active pattern region.

Another example of the present disclosure is an array substrate comprising a thin-film transistor according to one embodiment of the present disclosure.

Another example of the present disclosure is a display device comprising an array substrate according to one embodiment of the present disclosure.

Another example of the present disclosure is a method of fabricating a thin-film transistor. The method of fabricating a thin-film transistor may comprise forming an active layer, a source electrode, and a drain electrode on a base substrate. The source electrode and the drain electrode may be both coupled to the active layer. The active layer may comprise an active pattern region. The active pattern region may comprise a main body portion and a plurality of protrusion portions on both sides of the main body portion. The protrusion portions may be connected to the main body portion.

In one embodiment, forming the active layer, the source electrode, and the drain electrode may comprise forming a thin film of active layer material on the base substrate; forming an etch barrier layer in a first region on a side of the thin film of the active layer material away from the base substrate, the first region including a main body region and protrusion regions; forming a thin film of conductive material on a side of the etch barrier layer away from the substrate and a side of the thin film of active layer material away from the substrate; forming a photoresist layer on a side of the thin film of conductive material away from the substrate; exposing and developing the photoresist layer using a mask plate, the photoresist layer in corresponding areas where the source electrode and the drain electrode are to be formed are retained; and etching the thin film of conductive material and the thin film of active layer material so that the active layer, the source electrode, and the drain electrode are obtained.

In one embodiment, forming the active layer, the source electrode, and the drain electrode may comprise forming a thin film of active layer material on the base substrate; forming a thin film of conductive material on a side of the thin film of active layer material away from the base substrate; forming a photoresist layer on a side of the thin film of conductive material away from the base substrate; exposing and developing the photoresist layer using a half tone mask plate, wherein a portion of the photoresist layer in a first region is retained, the first region including a main body region and protrusion regions; etching the thin film of conductive material and the thin film of active layer material so that the pattern of the active layer is obtained; ashing off the photoresist layer so that the photoresist layer in corresponding regions of the source electrode and the drain electrode is retained, and the photoresist layer in the first region is removed; and etching the thin film of conductive material so that the pattern of the source electrode and the drain electrode are obtained.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
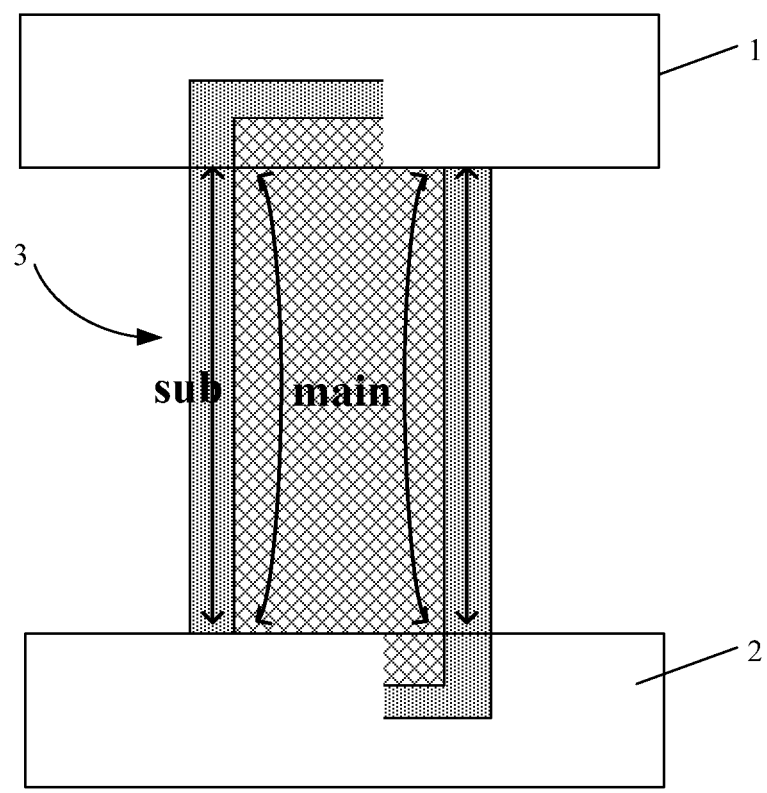
FIG. 1 is a top view of a conventional thin-film transistor.

The present disclosure will be described in further detail with reference to the accompanying drawings and embodiments in order to provide a better understanding of the technical solutions of the present disclosure by those skilled in the art. Throughout the description of the invention, reference is made to FIGS. 1-9. When referring to the figures, like structures and elements shown throughout are indicated with like reference numerals.

FIG. 1 is a top view of a conventional thin-film transistor. As shown in FIG. 1, the thin-film transistor includes a pattern of an active layer 3 having a rectangular shape, a source electrode 1 and a drain electrode 2 coupled to the pattern of the active layer 3. The source electrode 1 covers a portion of the pattern of the active layer 3, and the drain electrode 2 covers a portion of the pattern of the active layer 3. The portion of the pattern of the active layer 3 that is not covered by the source electrode 1 and the drain electrode 2 is a conductive region of the thin-film transistor. When a certain gate-source voltage is applied to the thin-film transistor, a conductive channel is formed in the conductive region. As such, the source electrode 1 and the drain electrode 2 of the thin-film transistor are turned on.

In fabricating a thin film transistor, when a thin film of active layer material is etched to form a pattern of an active layer 3 by an etching process, it is likely to form a slope in edge regions of the pattern of the active layer 3. As such, the conductive region includes a main conductive region (main) and two edge conductive regions (sub) located on both sides of the main conductive region. The edge conductive region forms a slope from the main conductive region.

As shown in FIG. 1, since the edge conductive regions have a narrow width, when carriers move between the source electrode 1 and the drain electrode 2 in the edge conductive regions, the motion path thereof is linear. That is, a length of the channels of the edge conductive regions is approximately equal to a distance between the source electrode 1 and the drain electrode 2. Accordingly, the threshold voltage of the edge conductive regions is smaller than that of the main conductive region. The conductive channel at the edge conductive regions is formed earlier than at the main conductive region. That is, the edge conductive regions become conductive before the main conductive region. As such, there will be current leakage in the edge conductive regions. As a result, humping phenomenon occurs in a volt-ampere characteristic curve of the thin-film transistor, and stability of the thin-film transistor is poor.

Figure 2:
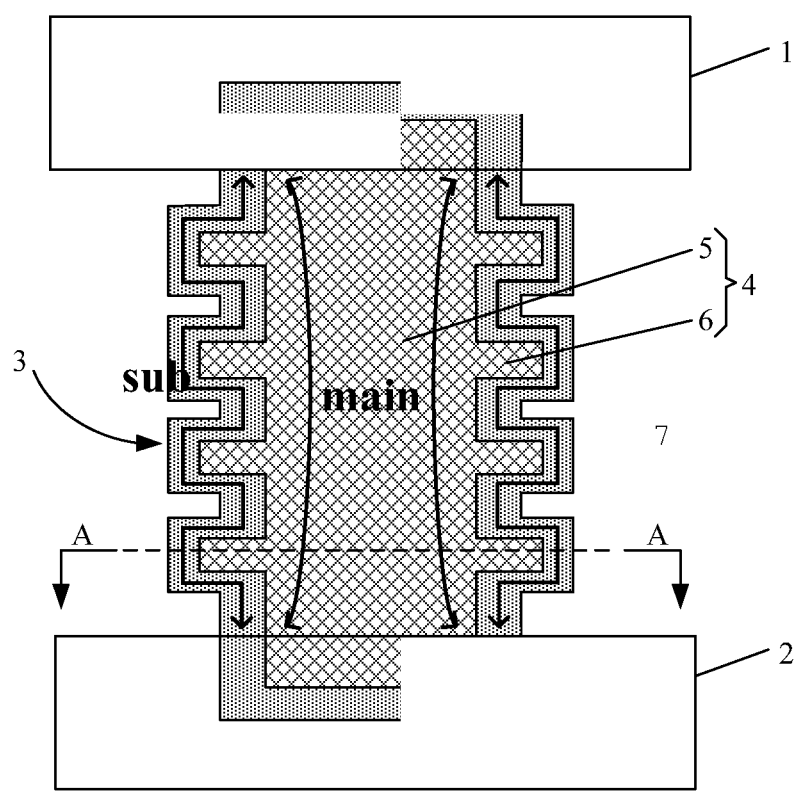
FIG. 2 is a top view of a thin-film transistor according to one embodiment of the present disclosure.
Figure 3:
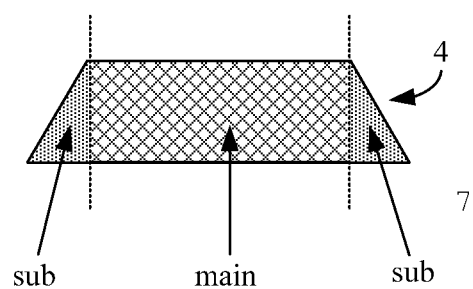
FIG. 3 is a schematic cross-sectional view taken along the line A-A in FIG. 2.

FIG. 2 is a top view of a thin-film transistor according to one embodiment of the present disclosure. FIG. 3 is a schematic cross-sectional view taken along the line A-A in FIG. 2. As shown in FIGS. 2 and 3, the thin-film transistor includes a pattern of an active layer 3, a source electrode 1, and a drain electrode 2. The source electrode 1 covers a portion of the pattern of the active layer 3. The drain electrode 2 covers a portion of the pattern of the active layer 3. The portion of the pattern of the active layer 3 that is not covered by the source electrode 1 and the drain electrode 2 is an active pattern region 4. In one embodiment, the active pattern region 4 is conductive. In another embodiment, the active pattern region 4 is not conductive. The active pattern region 4 includes a main body portion 5 connecting the source electrode 1 and the drain electrode 2, and a plurality of protrusion portions 6 on both sides of the main body portion 5. The protrusion portions 6 are connected to the main body portion 5.

In one embodiment, the thin-film transistor may be a bottom-gate type thin-film transistor or a top-gate type thin-film transistor. The source electrode 1 and the drain electrode 2 may be located either above the active layer or under the active layer. The above characteristics are not limited thereto.

When the pattern of the active layer 3 of the present disclosure is prepared by a patterning process, it is likely to form a slope in edge regions of the pattern of active layer 3. As such, the active layer 3 includes an active pattern region 4 and two active edge regions 7 located on both sides of the active pattern region 4. The active edge regions 7 are the sloped regions away from the active pattern region 4 on both sides of the active pattern region 4.

In one embodiment, the protrusion portions 6 and the main body portion 5 are integrally molded by a single patterning process. In one embodiment, "the protrusion portions 6 are connected to the main body portion 5" refers to that side surfaces of the protrusion portions 6 are closely connected to side surfaces of the main body portion 5, and there is no slope between the two.

In one embodiment, a plurality of protrusion portions 6 are provided on both sides of the main body portion 5 connecting the source electrode 1 and the drain electrode 2, respectively. As such, a length of the active edge region connecting the source electrode 1 and the drain electrode 2 in the active layer 3 increases. A length of the corresponding channel of the active edge region also increases. Accordingly, a threshold voltage of the active edge region increases so that the active edge region becomes conductive later than the active pattern region. As such, it is possible to effectively solve the problem of the leakage current, which is generated when the active edge region becomes conductive earlier than the active pattern region.

Figure 4:
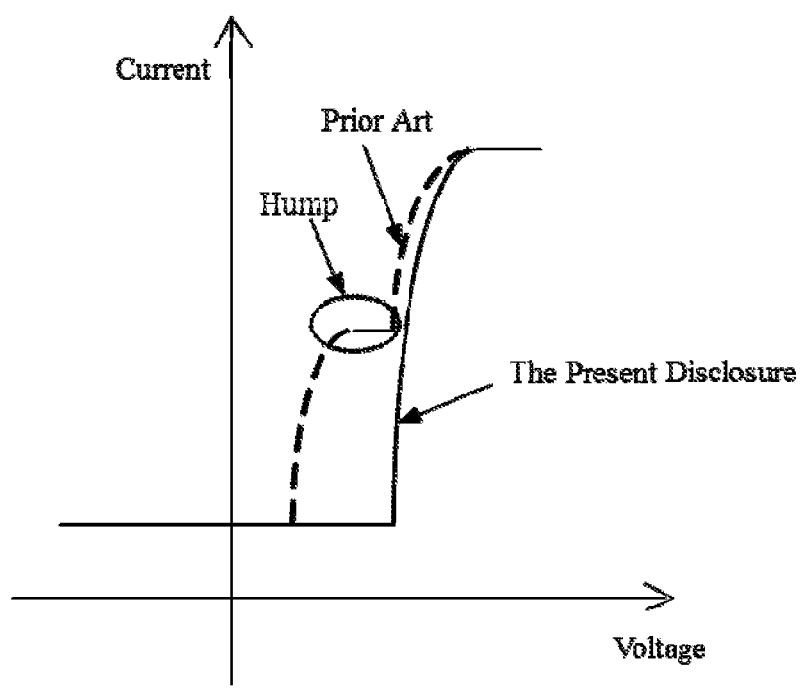
FIG. 4 is a schematic diagram of a volt-ampere characteristic curve of thin-film transistors provided in one embodiment of the present disclosure and the prior art.

FIG. 4 is a schematic diagram of volt-ampere characteristic curves of thin-film transistors provided in one embodiment of the present disclosure and the prior art. As shown in FIG. 4, for a thin-film transistor of prior art, the active edge region is turned on before the active pattern region. Thus, before the active pattern region is turned on, there is leakage current through the active edge region. As a result, humping phenomenon occurs in the volt-ampere characteristic curve of the thin-film transistor. However, for a thin-film transistor according to one embodiment of the present disclosure, the active edge regions thereof are turned on after the active pattern region. Thus, there is no leakage current through the active edge regions. As a result, humping phenomenon does not occur in the volt-ampere characteristic curve of the thin-film transistor, and accordingly stability of the thin-film transistor is better.

In one embodiment, once shapes of protrusion portions 6 inside the active edge region are fixed, the greater the number of the protrusion portions 6, the longer the length of the active edge region, the longer the corresponding channel length of the active edge region, and the greater the threshold voltage of the active edge region.

In addition, it is only one embodiment of the present disclosure in which the shape of the protrusion portion 6 is rectangular as shown in the FIG. 2, and the shape of the protrusion portion 6 is not limited thereto.

Figure 5:
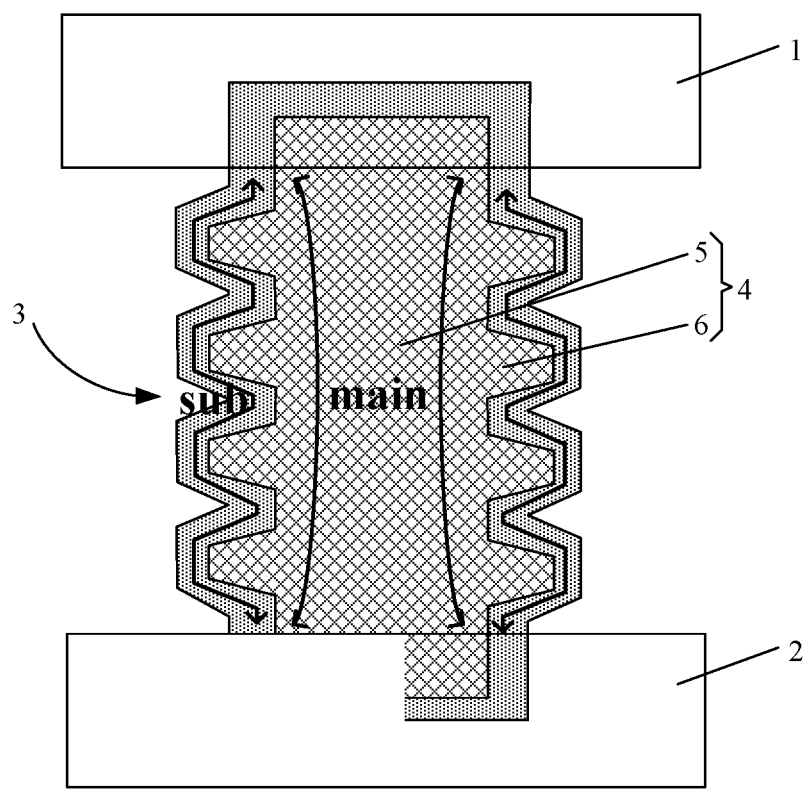
FIG. 5 is a top view of a thin-film transistor according to one embodiment of the present disclosure.
Figure 6:
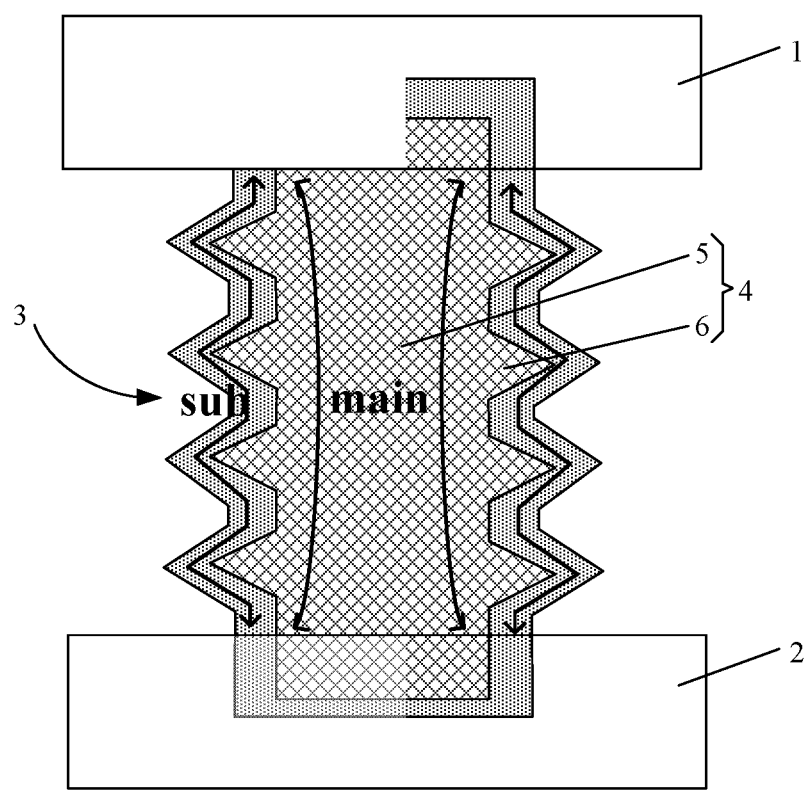
FIG. 6 is a top view of a thin-film transistor according to one embodiment of the present disclosure.

FIG. 5 and FIG. 6 are top views of thin-film transistors according to two embodiments of the present disclosure, respectively. As shown in FIGS. 5 and 6, the shape of the protrusion portions 6 shown in FIG. 5 is trapezoidal and the shape of the protrusion portions 6 shown in FIG. 6 is triangular. They are different from the shape of the protrusion portions 6 shown in FIG. 3. Of course, the shape of the protrusion portions 6 in the present disclosure may be other shapes.

The protrusion portions 6 connected to the main body portion 5 are provided on both sides of the main body portion 5 so that the length of the active edge region is increased and that the threshold voltage of the active edge region is greater than that of the active pattern region. The technical scheme as such falls within scope of the present disclosure.

In one embodiment, the numbers of the protrusion portions 6 on both sides of the main body portion 5 are equal. As such, the lengths of the active edge regions on both left and right sides of the main body portion 5 are equal. Accordingly, the threshold voltages of the active edge regions on the left and right sides are equal. That is, the active edge regions on the left and right sides are turned on or off at the same time, thereby facilitating control of current of the thin-film transistor.

In one embodiment, the active pattern region 4 may be an axial symmetric or central symmetric pattern. It is possible to effectively ensure operational stability of the thin-film transistor by ensuring that the portion of the pattern of the active layer 3 that is not covered by the source electrode 1 and the drain electrode 2 is an axial symmetric or central symmetric pattern.

Figure 7:
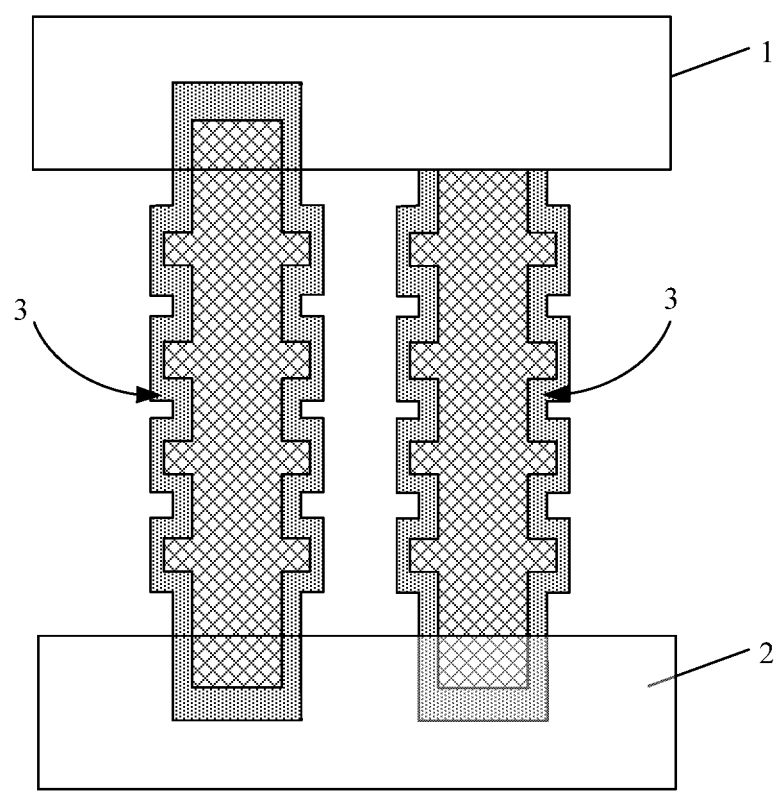
FIG. 7 is a top view of a thin-film transistor according to one embodiment of the present disclosure.

FIG. 7 is a top view of a thin-film transistor according to one embodiment of the present disclosure. As shown in FIG. 7, unlike the above-described embodiment, the number of the patterns of the active layer 3 in the thin-film transistor provided in this embodiment is two or more. Some of the schematics are not shown in the figures. In the case when an area for a semiconductor layer required in a thin-film transistor is constant, the entire semiconductor layer may be designed to comprise two or more independent patterns of active layers 3. As such, spaces between adjacent patterns of active layers 3 can effectively promote heat dissipation, thereby enhancing thermal stability of the thin-film transistor during operation.

Furthermore, in designing a pattern of an active layer 3, when a width of a main body portion 5 is too small, it is more difficult to fabricate the pattern of the active layer 3. When a width of a main body portion 5 is too large, heat dissipation effect of the pattern of the active layer 3 is poor. In one embodiment, a width of the main body portion 5 in a pattern of an active layer 3 is within a range from 5 um to 15 um. As such, heat dissipation effect of the pattern of the active layer 3 can be ensured while it is still easy to fabricate the pattern of the active layer 3.

Another example of the present disclosure is an array substrate. The array substrate includes a thin-film transistor according to one embodiment of the present disclosure. The detail thereof can be found in the above-described embodiments, which will not be repeated here.

Another example of the present disclosure is a display device. The display device includes an array substrate according to one embodiment of the present disclosure. The detail thereof will not be repeated here.

The display device of the present embodiment may be a liquid crystal panel, an electronic paper, an OLED panel, a mobile phone, a tablet computer, a television set, a monitor, a notebook computer, a digital photo frame, a navigator, or any other products or components having a display function.

Another example of the present disclosure is a method for fabricating a thin-film transistor. The method is used for fabricating the thin-film transistor according to one embodiment of the present disclosure. The fabrication method includes the following steps:

In step S1, a pattern of an active layer, a source electrode and a drain electrode are formed on a base substrate. The source electrode and the drain electrode are both coupled to the active layer. The source electrode covers a portion of the pattern of the active layer. The drain electrode covers a portion of the pattern of the active layer. The portion of the pattern of the active layer that is not covered by the source electrode and the drain electrode is an active pattern region. In one embodiment, the active pattern region is conductive. In another embodiment, the active pattern region is not conductive. The active pattern region includes a main body portion connecting both the source electrode and the drain electrode and a plurality of protrusion portions on both sides of the main body portion. The protrusion portions are connected to the main body portion.

In one embodiment, the thin-film transistor may be a top-gate thin-film transistor or a bottom-gate thin-film transistor. When the thin-film transistor is a bottom-gate type thin-film transistor, the fabrication method also includes steps of forming a gate and a gate insulating layer before the step of forming the pattern of the active layer. When the thin-film transistor is a top-gate type thin-film transistor, the fabrication method also includes forming a gate and a gate insulating layer after the step of forming the pattern of the active layer.

Figure 8:
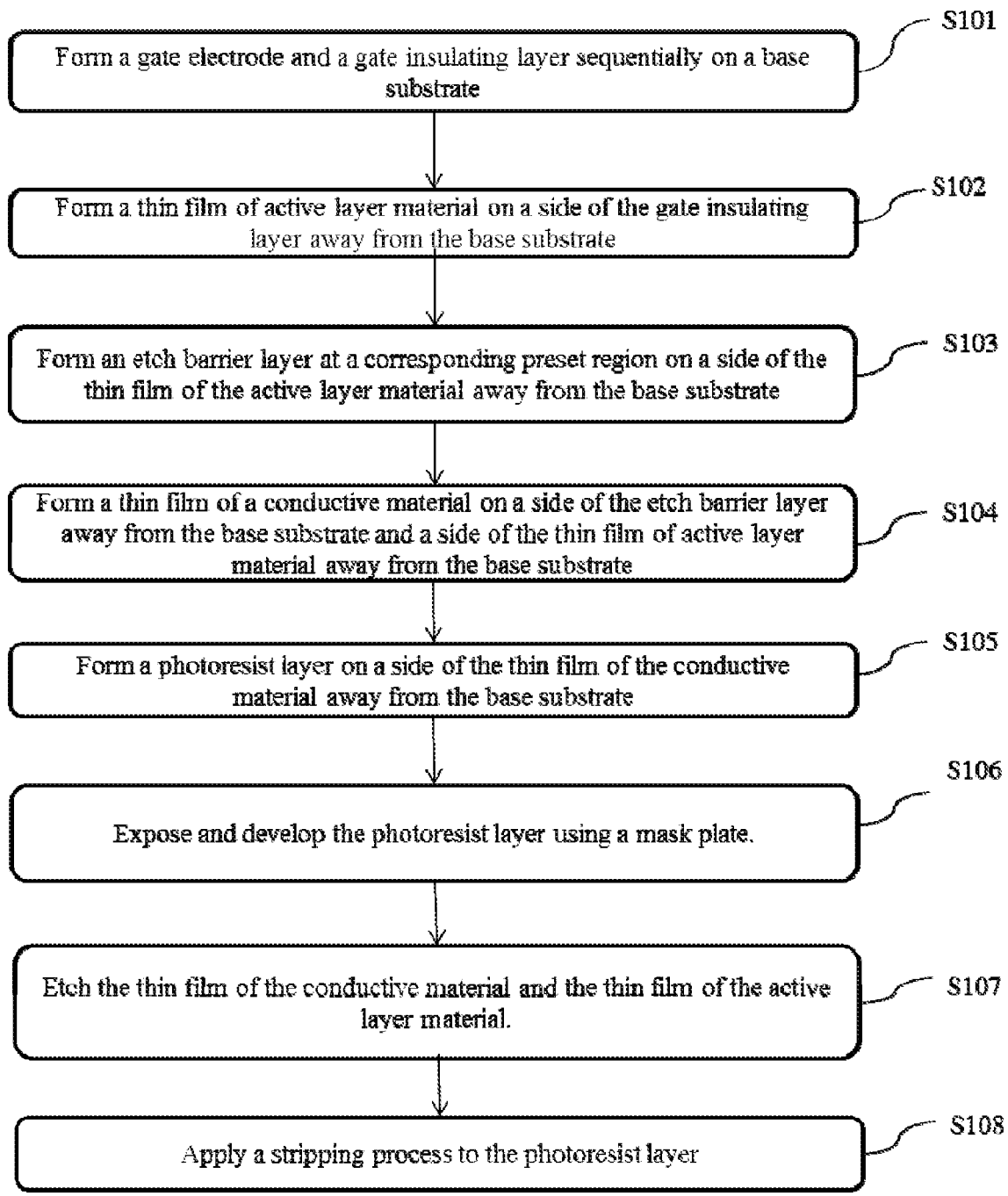
FIG. 8 is a flowchart of a method of fabricating a thin-film transistor according to one embodiment of the present disclosure.

FIG. 8 is a flowchart of a method of fabricating a thin-film transistor according to one embodiment of the present disclosure. The fabrication method is used for preparing the thin-film transistor in the above-described embodiments. Take a bottom gate type thin-film transistor as an example, the fabrication method includes the following steps:

In step S101, a gate electrode and a gate insulating layer are formed sequentially on a base substrate.

In one embodiment, a pattern of a gate electrode is formed on a base substrate by a patterning process. Then, a gate insulating layer is formed on a side of the gate electrode away from the base substrate by coating, magnetron sputtering, or vapor deposition. The patterning process in the present disclosure may refer to a process including photosensitive resist coating, light exposure, development, etching, photosensitive resist stripping, and the like.

In step S102, a thin film of active layer material is formed on a side of the gate insulating layer away from the base substrate.

In one embodiment, a thin film of active layer material may be formed over a gate insulating layer by coating, magnetron sputtering, or vapor deposition. In one embodiment, the active layer material is a metal oxide semiconductor material.

In step S103, an etch barrier layer is formed at a corresponding first region on a side of the thin film of the active layer material away from the base substrate.

In one embodiment, first, a thin film of etch barrier layer material is formed over the thin film of the active layer material by coating, magnetron sputtering or vapor deposition. Then, the thin film of etch barrier layer material is subject to a patterning process to obtain a pattern of the etch barrier layer in a first region. The first region includes a main body region and protrusion regions. The main body region corresponds to the main body portion of the active pattern region to be formed. The protrusion regions correspond to the protrusion portions of the active pattern region to be formed.

In step S104, a thin film of a conductive material is formed on a side of the etch barrier layer away from the base substrate and a side of the thin film of active layer material away from the base substrate.

In one embodiment, a layer of conductive material may be formed over the thin film of the active layer material by coating, magnetron sputtering, or vapor deposition. The conductive material may be a metallic material.

In step S105, a photoresist layer is formed on a side of the thin film of the conductive material away from the base substrate.

In step S106, the photoresist layer is exposed and developed using a mask plate. The portions of the photoresist layer in corresponding areas where the source electrode and the drain electrode are to be formed are completely retained.

In step S107, the thin film of the conductive material and the thin film of the active layer material are etched. The portions of the thin film of the conductive material under the retained photoresist layer are completely retained to obtain patterns of a source electrode and a drain electrode. The portions of the thin film of the active layer material under the retained photoresist layer and under the retained etch barrier layer are completely retained to obtain a pattern of an active layer. In one embodiment, a wet etch process is used to etch the thin film of the conductive material and the thin film of the active layer material.

In step S108, the photoresist layer is subjected to a stripping process.

As such, a thin-film transistor according to one embodiment of the present disclosure can be obtained by the above-described steps S101 to S108.

Figure 9:
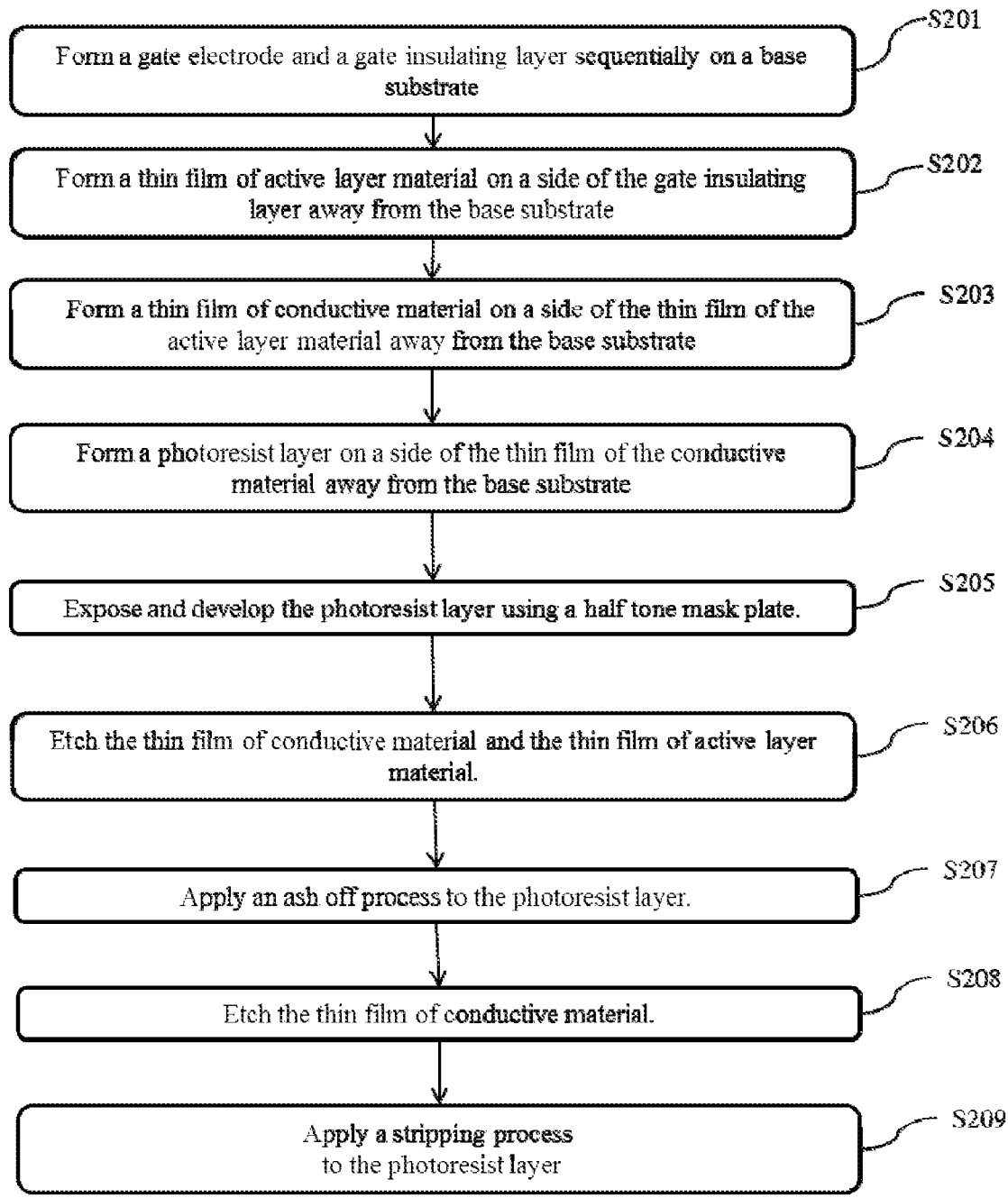
FIG. 9 is a flowchart of a method of fabricating a thin-film transistor according to one embodiment of the present disclosure.

FIG. 9 is a flowchart of a method of fabricating a thin-film transistor according to an embodiment of the present disclosure. The fabrication method is used for fabricating a thin-film transistor in the above-described embodiments. Taking a bottom-gate type thin-film transistor as an example, the fabrication method includes the following steps:

In step S201, a gate electrode and a gate insulating layer are formed sequentially on a base substrate.

In step S202, a thin film of active layer material is formed on a side of the gate insulating layer away from the base substrate.

In step S203, a thin film of conductive material is formed on a side of the thin film of the active layer material away from the base substrate.

In step S204, a photoresist layer is formed on a side of the thin film of the conductive material away from the base substrate.

In step S205, the photoresist layer is exposed and developed using a half tone mask plate. The portions of the photoresist layer in corresponding regions of the source electrode and the drain electrode to be formed are completely retained. The portion of the photoresist in a first region is partly retained. The first region includes a main body region and protrusion regions. The main body region corresponds to the main body portion of the active pattern region to be formed. The protrusion regions correspond to the protrusion portions of the active pattern region to be formed.

In step S206, the thin film of conductive material and the thin film of active layer material are etched. The portions of the thin film of conductive material and the thin film of active layer material under the retained photoresist layer are retained to obtain a pattern of an active layer.

In step S207, the photoresist layer is subject to an ash off process. In one embodiment, the portions of the photoresist layer in corresponding regions of the source electrode and the drain electrode are retained. The portion of the photoresist layer in the first region is completely removed.

In step S208, the thin film of conductive material is etched. The portion of the thin film of conductive material under the retained photoresist layer is completely retained to obtain patterns of a source electrode and a drain electrode.

In step S209, the photoresist is subjected to a stripping process.

As such, the thin-film transistor in the embodiments of the current disclosure can be obtained by the above-described steps S201 to S209.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A thin-film transistor comprising:
   an active layer;
   a source electrode; and
   a drain electrode;
   wherein the active layer comprises an active pattern region, the active pattern region comprising a main body portion and a plurality of protrusion portions on both sides of the main body portion, and the protrusion portions are connected to the main body portion;
   the active layer comprises active edge regions on both sides of the active pattern region, and a threshold voltage of either of the active edge regions is greater than that of the active pattern region; and
   the active edge regions are sloped regions away from the active pattern region on both sides of the active pattern region.

2. The thin-film transistor according to claim 1, wherein the protrusion portions have a shape of rectangular, triangular, or trapezoidal.

3. The thin-film transistor according to claim 1, wherein the protrusion portions and the main body portion are substantially in a same plane.

4. The thin-film transistor according to claim 1, wherein there are equal number of the protrusion portions on both sides of the main body portion.

5. The thin-film transistor according to claim 1, wherein there is no slope between the main body portion and the protrusion portions.

6. The thin-film transistor according to claim 1, wherein the active pattern region is axial symmetric or central symmetric.

7. The thin-film transistor according to claim 1, wherein the thin-film transistor comprises two or more patterns of the active layer.

8. The thin-film transistor according to claim 1, wherein a width of the main body portion is between 5 μm and 15 μm.

9. An array substrate comprising the thin-film transistor according to claim 1.

10. A display device comprising the array substrate according to claim 9.

11. A method of fabricating a thin-film transistor, comprising:

forming an active layer, a source electrode, and a drain electrode on a base substrate, wherein the source electrode and the drain electrode are both coupled to the active layer, the active layer comprises an active pattern region, the active pattern region comprising a main body portion and a plurality of protrusion portions on both sides of the main body portion, and the protrusion portions are connected to the main body portion; and the active layer comprises active edge regions on both sides of the active pattern region, and a threshold voltage of either of the active edge regions is greater than that of the active pattern region; and the active edge regions are sloped regions away from the active pattern region on both sides of the active pattern region.

12. The method of fabricating a thin-film transistor according to claim 11, wherein forming the active layer, the source electrode, and the drain electrode comprises:

forming a thin film of active layer material on the base substrate;

forming an etch barrier layer in a first region on a side of the thin film of the active layer material away from the base substrate, the first region including a main body region and protrusion regions;

forming a thin film of conductive material on a side of the etch barrier layer away from the substrate and a side of the thin film of active layer material away from the substrate;

forming a photoresist layer on a side of the thin film of conductive material away from the substrate;

exposing and developing the photoresist layer using a mask plate, the photoresist layer in corresponding areas where the source electrode and the drain electrode are to be formed are retained; and etching the thin film of conductive material and the thin film of active layer material so that the active layer, the source electrode, and the drain electrode are obtained.

13. The method of fabricating a thin-film transistor according to claim 11, wherein forming, the active layer, the source electrode, and the drain electrode comprises:

forming a thin film of active layer material on the base substrate;

forming a thin film of conductive material on a side of the thin film of active layer material away from the base substrate;

forming a photoresist layer on a side of the thin film of conductive material away from the base substrate;

exposing and developing the photoresist layer using a half tone mask plate, wherein a portion of the photoresist layer in a first region is retained, the first region including a main body region and protrusion regions;

etching the thin film of conductive material and the thin film of active layer material so that the pattern of the active layer is obtained;

ashing off the photoresist layer so that the photoresist layer in corresponding regions of the source electrode and the drain electrode is retained, and the photoresist layer in the first region is removed; and etching the thin film of conductive material so that the pattern of the source electrode and the drain electrode are obtained.

* * * * *